US009841793B2

(12) United States Patent
Kwon et al.

(10) Patent No.: US 9,841,793 B2
(45) Date of Patent: Dec. 12, 2017

(54) SOLID STATE DRIVE COOLING IN DENSE STORAGE

(71) Applicant: Dell Products, L.P., Round Rock, TX (US)

(72) Inventors: Haesung Kwon, Austin, TX (US); Kevin Warren Mundt, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 14/815,840

(22) Filed: Jul. 31, 2015

(65) Prior Publication Data

US 2017/0038802 A1    Feb. 9, 2017

(51) Int. Cl.
| | | |
|---|---|---|
| G06F 1/20 | (2006.01) | |
| G11B 33/00 | (2006.01) | |
| H05K 7/20 | (2006.01) | |

(52) U.S. Cl.
CPC ............ G06F 1/20 (2013.01); G11B 33/00 (2013.01); H05K 7/20418 (2013.01)

(58) Field of Classification Search
CPC ........... H05K 7/20154; H05K 7/20445; H05K 7/20418; H05K 7/20409; G06F 1/20
See application file for complete search history.

(56) References Cited

U.S. PATENT DOCUMENTS

| 7,388,749 B1* | 6/2008 | Feroli | G11B 33/121 361/679.48 |
|---|---|---|---|
| 2003/0169983 A1* | 9/2003 | Branch | G02B 6/4201 385/92 |
| 2005/0231917 A1* | 10/2005 | Lin | G06F 1/20 361/703 |
| 2007/0115643 A1* | 5/2007 | Chen | H01L 23/4006 361/719 |
| 2008/0037222 A1* | 2/2008 | Jha | H05K 7/20445 361/709 |
| 2010/0195289 A1* | 8/2010 | Hubal | G06F 1/181 361/733 |
| 2010/0271781 A1* | 10/2010 | Busch | H05K 7/20445 361/704 |
| 2010/0302729 A1* | 12/2010 | Tegart | H05K 7/209 361/692 |
| 2011/0199731 A1* | 8/2011 | Kuwahara | H05K 7/20154 361/697 |

(Continued)

Primary Examiner — Hoa C Nguyen
Assistant Examiner — Keith Depew
(74) Attorney, Agent, or Firm — Norton Rose Fulbright US LLP

(57) ABSTRACT

Embodiments of apparatuses, systems and methods related to Solid State Drive (SSD) cooling in dense storage are described. An embodiment of an apparatus may include a housing. The apparatus may also include a first set of peripheral heatsink fins disposed parallel to a first axis of the housing. Additionally, the apparatus may include a second set of peripheral heatsink fins disposed parallel to a second axis of the housing. Also, the apparatus may include a set of heatsink members disposed adjacent the first set of peripheral heatsink fins and the second set of peripheral heatsink fins, the set of heat sink members configured to align with at least one of the first set of peripheral heatsink fins and the second set of peripheral heatsink fins.

17 Claims, 6 Drawing Sheets

(56) References Cited

U.S. PATENT DOCUMENTS

| | | | | |
|---|---|---|---|---|
| 2012/0103589 A1* | 5/2012 | Sohn | ............... | H05K 7/209 |
| | | | | 165/185 |
| 2012/0281364 A1* | 11/2012 | Gunderson | .......... | H05K 5/0256 |
| | | | | 361/714 |
| 2014/0063721 A1* | 3/2014 | Herman | ............... | G06F 1/20 |
| | | | | 361/679.31 |
| 2014/0146462 A1* | 5/2014 | Coglitore | .............. | G06F 1/187 |
| | | | | 361/679.33 |
| 2014/0268536 A1* | 9/2014 | Herman | ............... | H05K 3/30 |
| | | | | 361/679.31 |
| 2015/0250022 A1* | 9/2015 | Kim | .................... | H04W 88/08 |
| | | | | 455/561 |
| 2015/0327402 A1* | 11/2015 | Slippey | ............. | H05K 7/20436 |
| | | | | 361/714 |
| 2016/0128226 A1* | 5/2016 | Stellick | ............. | H05K 7/20727 |
| | | | | 361/679.46 |
| 2016/0259754 A1* | 9/2016 | Ping | ................... | G06F 3/0688 |
| 2016/0270205 A1* | 9/2016 | Kamimura | .......... | H05K 1/0203 |
| 2016/0270261 A1* | 9/2016 | Matsuda | ............ | H05K 7/20445 |

\* cited by examiner

SOLID STATE DRIVE COOLING IN DENSE STORAGE

FIELD

This disclosure relates generally to information handling systems, and more specifically, to Solid State Drive (SSD) cooling in dense storage.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In some information handling systems, data is stored in a hard drive device. One type of hard drive device is an SSD which uses solid state circuitry for data storage, rather than magnetic disks. Typical hard drive devices are designated as 2.5" drives or 3.5" drives, because of the physical dimensions or form factor of the devices, although other form factors may exist. Industry standard hard drives typically consume twelve (12) Watts of power or less, although some drives may consume up to twenty-five (25) Watts of power. As capacity in SSDs increases, power consumption is trending more to the 25 Watt regime.

Typical servers are have been designed with reference to 12 Watt drives. The trend toward 25 Watt devices poses several design issues, including heat dissipation issues. In order to cool the higher power drives, more air needs to be drawn across surfaces of the housing. As used herein, the term "housing" refers to industry standard mass storage device form factor housings. Some device manufacturers have started to incorporate heat sink fins in the housing of SSDs. The heat sink fins provide greater total surface area for heat dissipation. Additionally, in some systems the heat sink fins may reduce airflow impedance at the front of the server.

An example of an SSD with heatsink fins is illustrated in FIG. 1. FIG. 1 illustrates an SSD 100 of the prior art. The SSD 100 includes a first housing portion 102 and a second housing portion 104 coupled together by a housing fastener 106, such as a screw. Heatsink fins 108 are formed along the length of at least one of the first housing portion 102 or the second housing portion 104. Corresponding grooves 110 are also formed along the length of the drive resulting in an overall increase in the surface area of the housing which is useful for heat dissipation. Additionally, the heatsink fins 108 and grooves 110 direct air flow along the length of the SSD 100.

The SSD heatsink features are beneficial for drives that are inserted into the front of a server. A problem arises when the SSDs are inserted in a server where the air flows perpendicular to the drive. An example is the storage blade in drawer-chassis modular server. In this implementation the drives are mounted sideways in the chassis. The heatsink fins of FIG. 1 are of no value when the air flows perpendicular to the heatsink fins. In this instance the fins actually impede the flow of air and reduce overall cooling efficiency.

SUMMARY

Embodiments of apparatuses, systems and methods related to Solid State Drive (SSD) cooling in dense storage are described. An embodiment of an apparatus may include a housing. The apparatus may also include a first set of peripheral heatsink fins disposed parallel to a first axis of the housing. Additionally, the apparatus may include a second set of peripheral heatsink fins disposed parallel to a second axis of the housing. Also, the apparatus may include a set of heatsink members disposed adjacent the first set of peripheral heatsink fins and the second set of peripheral heatsink fins, the set of heat sink members configured to align with at least one of the first set of peripheral heatsink fins and the second set of peripheral heatsink fins.

In an embodiment, the set of heatsink members is configured to align with both first set of peripheral heatsink fins and the second set of peripheral heatsink fins. In a further embodiment, the set of heatsink members comprise a field of heatsink pins.

In another embodiment, the set of heatsink members are disposed on a configurable heatsink plate. In such an embodiment, the heatsink members may be configured to align with the first set of peripheral heatsink fins when the heatsink plate is disposed in a first configuration. Alternatively, the heatsink members are configured to align with the second set of peripheral heatsink fins when the heatsink plate is disposed in a second configuration. Additionally, the apparatus may include an attachment mechanism for coupling the heatsink plate to the housing in one or more of a plurality of configurations.

In such embodiments, the housing is configured to house components of a Solid State Drive (SSD). For example, the SSD may be configured to consume up to 25 Watts of power. The housing may be configured to be attachable to a high-density drive storage chassis.

An embodiment of a system may include a server, a hard drive chassis coupled to the server, the hard drive chassis configured to store a plurality of Solid State Drive (SSD) devices in a high-density configuration, and an airflow system coupled to the hard drive chassis, the airflow system configured to generate airflow through the hard drive chassis for cooling the plurality of SSD devices. The system may also include a plurality of SSD devices, the SSD devices including: a housing, a first set of peripheral heatsink fins disposed parallel to a first axis of the housing, a second set of peripheral heatsink fins disposed parallel to a second axis of the housing, and a set of heatsink members disposed adjacent the first set of peripheral heatsink fins and the second set of peripheral heatsink fins, the set of heat sink members configured to align with at least one of the first set of peripheral heatsink fins and the second set of peripheral heatsink fins.

An embodiment of a method may include providing a housing having a first set of peripheral heatsink fins disposed parallel to a first axis of the housing, and a second set of peripheral heatsink fins disposed parallel to a second axis of the housing, and a set of heatsink members disposed adjacent the first set of peripheral heatsink fins and the second set of peripheral heatsink fins, the set of heat sink members configured to align with at least one of the first set of peripheral heatsink fins and the second set of peripheral heatsink fins.

The method may also include determining a direction of airflow in a high-density drive storage system, and arranging the set of heatsink members in response to the direction of airflow.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Embodiments of methods and systems for SSD cooling in dense storage are described. In an embodiment, the housing of SSDs may include an arrangement of heatsink features that accommodate airflow in a plurality of directions. In one embodiment, the housing is a 2.5" Small Form Factor (SFF) housing. In other embodiments, the housing may be a 3.5" Large Form Factor (LFF) housing, or the like. For example, in an embodiment, the heatsink features may include a field of heatsink members formed on a surface of the housing of SSDs. In such an embodiment, the heatsink members may be posts having a square, rectangular, circular, elliptical, or other geometric cross-section. In other embodiments, the heatsink members may be cones, frustums, or other three-dimensional geometric shapes.

In another embodiment, the heatsink features may include heatsink fins on a heatsink plate that is attachable to the housing of SSDs in a plurality of orientations, allowing for substantially uninterrupted airflow along the direction of orientation of the heatsink fins. In such an embodiment, peripheral heatsink fins may be formed in the housing of SSDs in a plurality of physical orientations to accommodate the plurality of orientations of the heatsink plate.

Beneficially, such embodiments may provide improved heat dissipation, particularly in systems that incorporate multi-directional airflow for SSD cooling.

Figure 1:
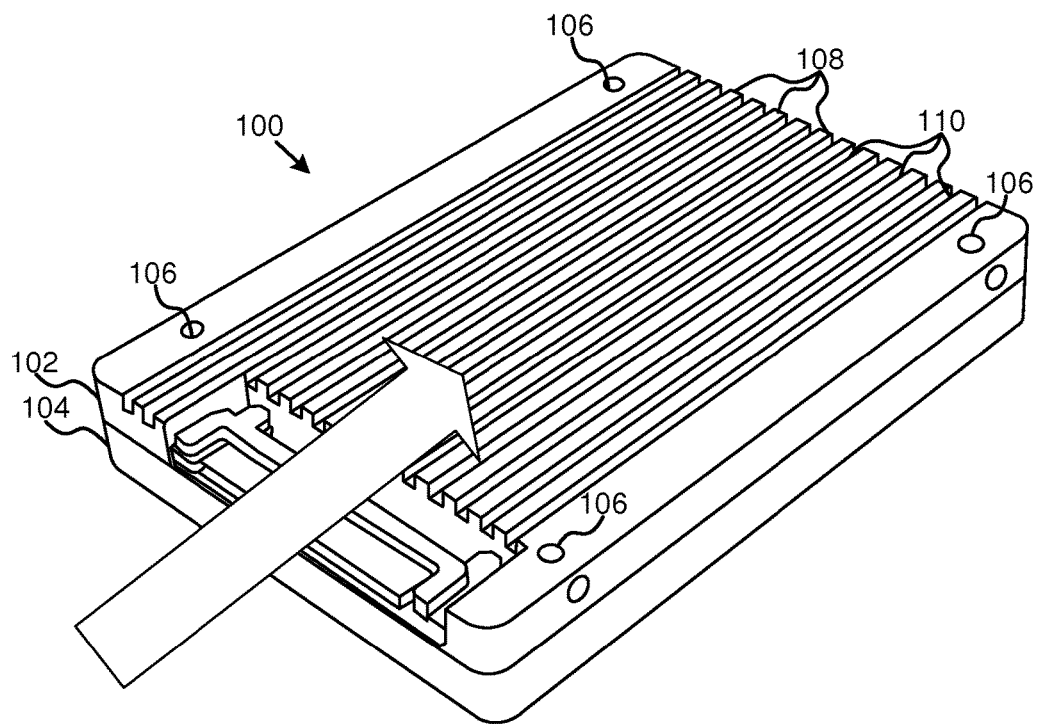
FIG. 1 is a schematic block diagram illustrating one embodiment of a system for SSD cooling in dense storage.
Figure 2:
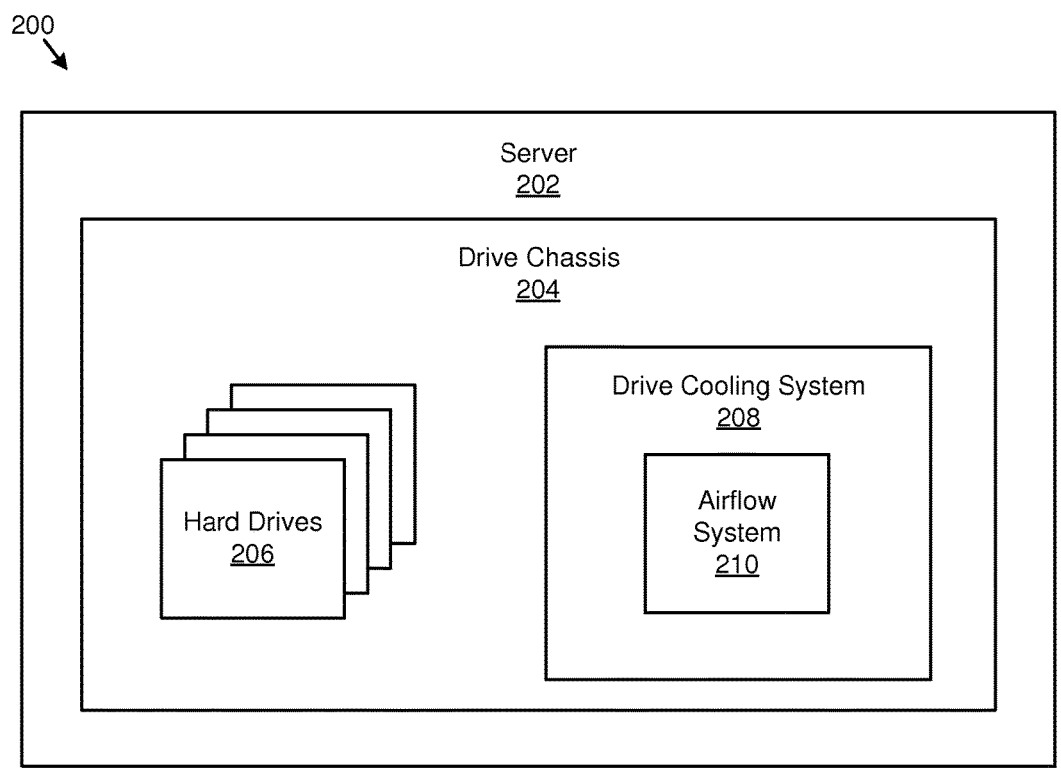
FIG. 2 is a schematic block diagram illustrating one embodiment of an Information Handling System (IHS) configured for SSD cooling in dense storage.

FIG. 2 illustrates one embodiment of a system 200 for SSD cooling in dense storage. In an embodiment, the system 200 includes a server 202. The server 202 may include a drive chassis 204 configured to hold one or more hard drives 206. For example, in some embodiments, the drive chassis 204 may be a drawer-style chassis for holding one or more SSDs. In certain embodiments, the drive cooling system 208 may include an airflow system 210.

The server 202 may be configured to provide 25 Watts or more of power to the hard drives 206, in some embodiments. In particular, the server 202 may be configured to accommodate high density SSD drives, where the SSD drives are configured to consume up to 25 Watts of power each. One of ordinary skill will recognize that the present embodiments may be equally suitable for use with alternative server configurations, drive power requirements, etc. One of ordinary skill will also recognize that the server 202 may not be necessary according to some embodiments. Rather, the hard drives 206 may be incorporated into a stand-alone chassis 204, such as a drive bay, RAID device, rack mount drive handling system, etc.

Indeed, one of ordinary skill will recognize a variety of drive chassis configurations, which are suitable for high density hard drive storage or management. Such embodiments, include hard drive blade configurations, drawer chassis, stacked chassis, multi-layer drive bays, etc.

An airflow system 210 may include, for example, vents in a housing of the server, vents in the drive chassis 204, fans, fan controllers, etc. In some embodiments, the airflow system 210 may cause air to flow along a first direction. For example, the first direction may be from front to back of the housing of the server 102. In further embodiments, the airflow system 210 may be configured to cause air to flow along a second direction. The second direction may be perpendicular to the first direction, or may be offset at one of a variety of angular offsets from the first direction. In such embodiments, the airflow system 210 may include a plurality of fans, each configured to cause air to flow along a different directional path. Alternatively, the airflow system 210 may include a system of ducts, baffles, or the like, configured for altering the flow path of air through the server 202.

Figure 3:
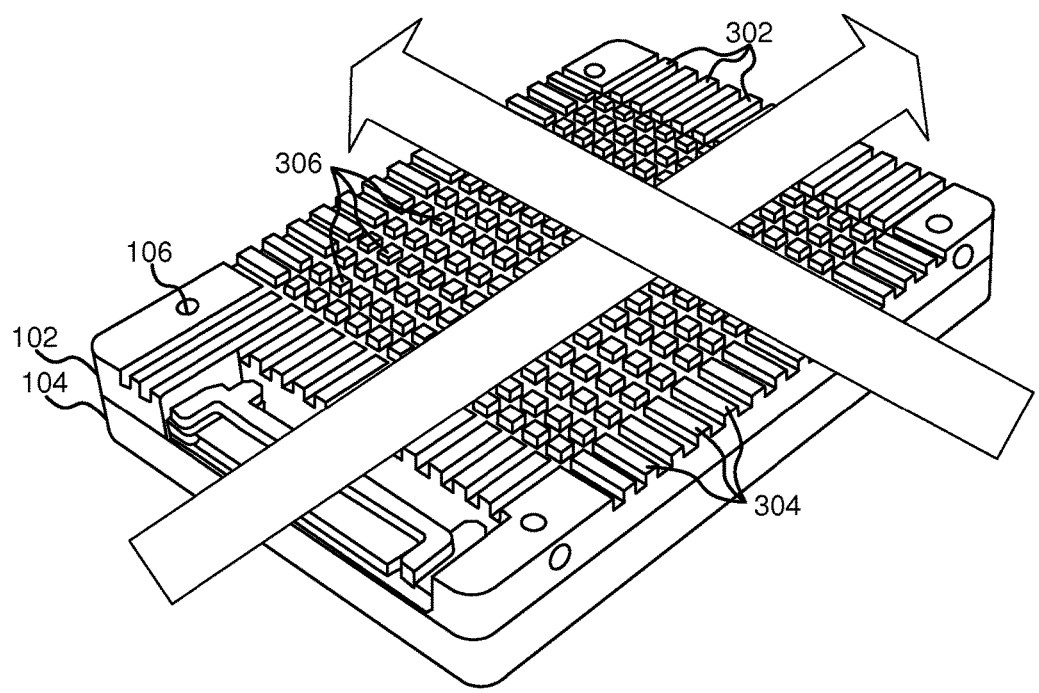
FIG. 3 is a schematic block diagram illustrating one embodiment of an apparatus for SSD cooling in dense storage.

FIG. 3 illustrates an embodiment of a hard drive 206, which may be configured for use in such systems. In an embodiment, the hard drive 206 may include a first housing portion 102 and a second housing portion 104. One of ordinary skill will recognize alternative housing configurations, which may be equally suitable for use according to the present embodiments, including embodiments that include a unitary housing. The first housing portion 102 and the second housing portion 104 may be coupled together by fasteners 106. On a surface of at least one of the first housing portion 102 or the second housing portion 104, a plurality of heatsink features may be formed. For example, heatsink features may include peripheral heatsink fins.

The embodiment of FIG. 3 may include a first set of peripheral heatsink fins 302 oriented in a first direction, and a second set of peripheral heatsink fins 304 oriented in a second direction. Additionally, the heatsink features may include a field of heatsink members 306 formed between the peripheral heatsink fins 302, 304. In various embodiments, the heatsink members 306 may be posts having a square, rectangular, circular, elliptical, or other geometric cross-section. In other embodiments, the heatsink members 306 may be cones, frustums, or other three-dimensional geometric shapes. Functionally, the heatsink members 306 may allow for airflow along a flow path parallel to the first set of peripheral heatsink fins 302, and also along a direction parallel to the second set of peripheral heatsink fins 304.

Figure 4:
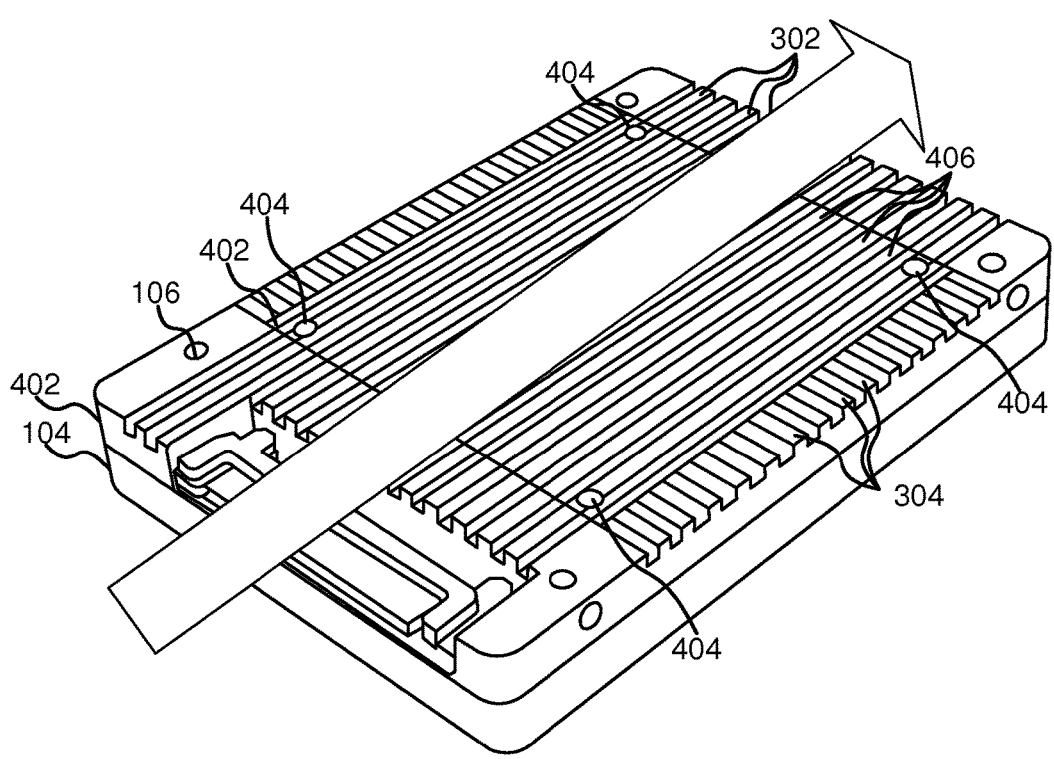
FIG. 4 is a schematic block diagram illustrating one embodiment of an apparatus for SSD cooling in dense storage.

FIG. 4 illustrates an alternative embodiment. The embodiment of FIG. 4 also includes the first set of peripheral heatsink fins 302 and the second set of peripheral heatsink fins 304. In the embodiment of FIG. 4, however, does not include the field of heatsink members 306. Instead, the embodiment of FIG. 4 includes a rotatable heatsink plate 402 having a plurality of heatsink fins 406 formed on a surface thereof. The heatsink plate 402 is securable to the first housing portion 102 by an attachment mechanism, such as fasteners 404. The embodiment of FIG. 4 may be configured to allow airflow in a direction substantially parallel to the first set of peripheral heatsink fins 302.

Figure 5:
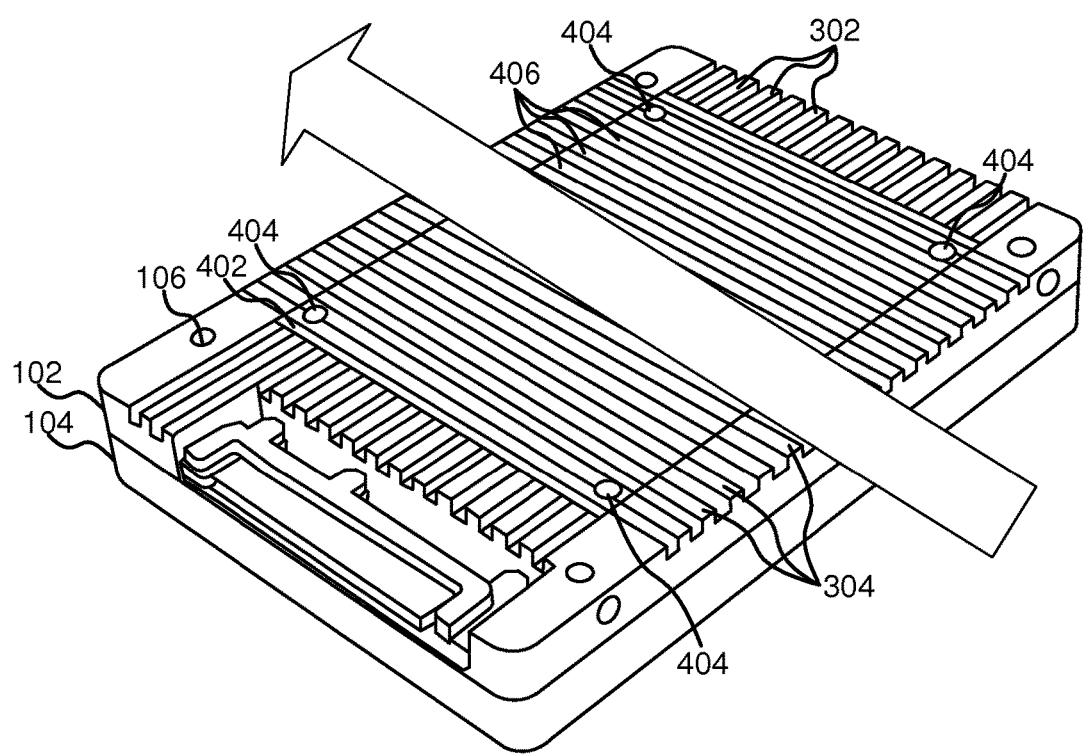
FIG. 5 is a schematic block diagram illustrating one embodiment of an apparatus for SSD cooling in dense storage.

In the embodiment of FIG. 5, the rotatable heatsink plate 402 may be rotated into alignment with the second set of peripheral heatsink fins 304. Thus, in the embodiment of FIG. 5, the hard drive 206 may be configured to make use of airflow along a path that is substantially parallel to the second set of peripheral heatsink fins 304.

Figure 6:
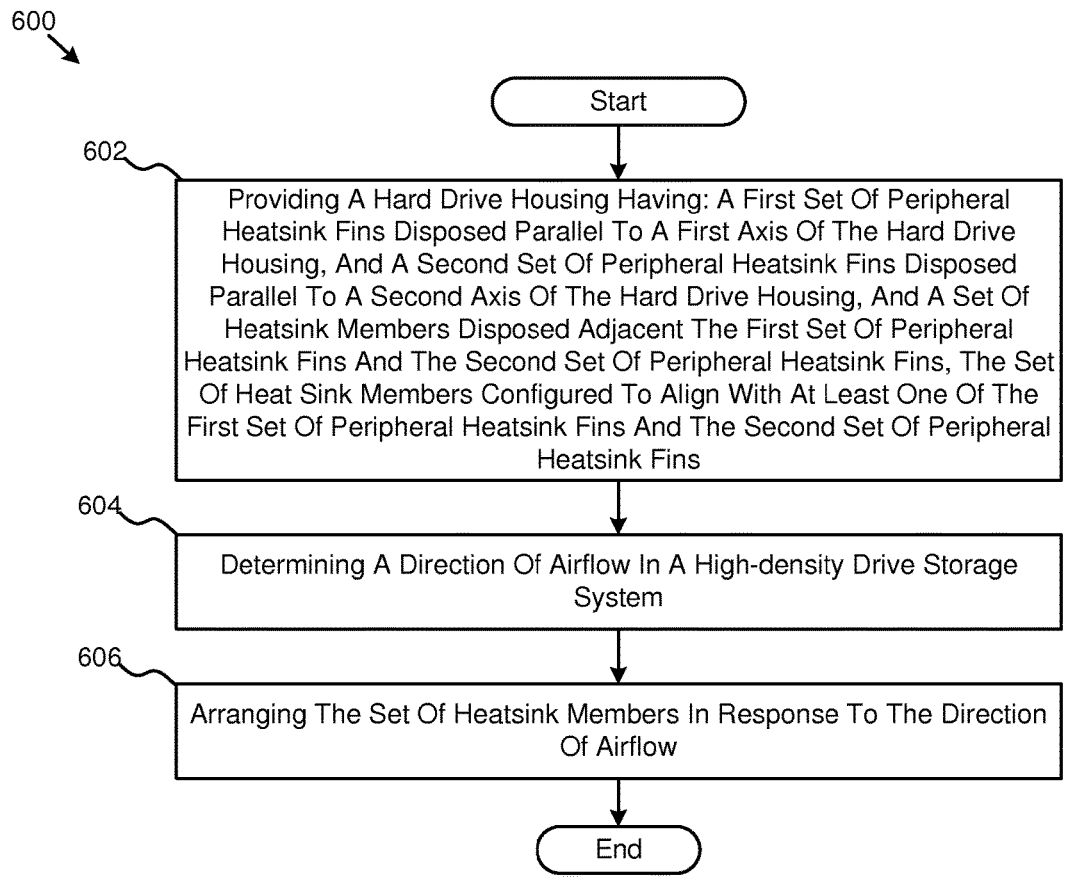
FIG. 6 is a schematic flowchart diagram illustrating one embodiment of a method for SSD cooling in dense storage.

FIG. 6 illustrates an embodiment of a method 600 for SSD cooling in dense storage. At block 602, the method includes providing a housing having: a first set of peripheral heatsink fins disposed parallel to a first axis of the housing; and a second set of peripheral heatsink fins disposed parallel to a second axis of the housing; and a set of heatsink members disposed adjacent the first set of peripheral heatsink fins and the second set of peripheral heatsink fins, the set of heat sink members configured to align with at least one of the first set of peripheral heatsink fins and the second set of peripheral heatsink fins. At block 604, the method 600 includes determining a direction of airflow in a high-density drive storage system. At block 606, the method includes arranging the set of heatsink members in response to the direction of airflow. One of ordinary skill will recognize that the method may include more or fewer steps than those described in FIG. 6.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An apparatus comprising: a housing; a first set of peripheral heatsink fins disposed parallel to a first axis of the housing; and a second set of peripheral heatsink fins disposed parallel to a second axis of the housing; and a set of heatsink plate fins disposed on a configurable heatsink plate adjacent to the first set of peripheral heatsink fins and the second set of peripheral heatsink fins, the set of heat sink plate fins configured to align with either the first set of peripheral heatsink fins or the second set of peripheral heatsink fins, and wherein the heatsink plate fins extend along a length of the configurable heatsink plate and are configured to align with the first set of peripheral heatsink fins when the heatsink plate is disposed in a first configuration.

2. The apparatus of claim 1, wherein the set of heatsink plate fins is configured to align with both the first set of peripheral heatsink fins, when the configurable heatsink plate is disposed in the first configuration, and the second set of peripheral heatsink fins, when the configurable heatsink plate is disposed in a second configuration.

3. The apparatus of claim 1, wherein the heatsink plate fins are configured to align with the second set of peripheral heatsink fins when the heatsink plate is disposed at a second configuration.

4. The apparatus of claim 1, further comprising an attachment mechanism for coupling the heatsink plate to the housing in one or more of a plurality of configurations.

5. The apparatus of claim 1, wherein the housing is configured to house components of a Solid State Drive (SSD).

6. The apparatus of claim 5, wherein the SSD is configured to consume up to 25 Watts of power.

7. The apparatus of claim 1, wherein the housing is configured to be attachable to a high-density storage chassis.

8. A system comprising: a server; a hard drive chassis coupled to the server, the hard drive chassis configured to store a plurality of Solid State Drive (SSD) devices in a high-density configuration; an airflow system coupled to the hard drive chassis, the airflow system configured to generate airflow through the hard drive chassis for cooling the plurality of SSD devices; and a plurality of SSD devices, the SSD devices comprising: a housing; a first set of peripheral heatsink fins disposed parallel to a first axis of the housing; and a second set of peripheral heatsink fins disposed parallel to a second axis of the housing; and a set of heatsink plate fins system comprising: a server; a hard drive chassis coupled to the server, the hard drive chassis configured to store a plurality of Solid State Drive (SSD) devices in a high-density configuration; an airflow system coupled to the hard drive chassis, the airflow system configured to generate airflow through the hard drive chassis for cooling the plurality of SSD devices; and a plurality of SSD devices, the SSD devices comprising: a housing; a first set of peripheral heatsink fins disposed parallel to a first axis of the housing; and a second set of peripheral heatsink fins disposed parallel to a second axis of the housing; and a set of heatsink plate fins disposed on a configurable heatsink plate adjacent to the first set of peripheral heatsink fins and the second set of peripheral heatsink fins, the set of heat sink plate fins configured to align with either the first set of peripheral heatsink fins or the second set of peripheral heatsink fins, and wherein the heatsink plate fins extend along a length of the configurable heatsink plate and are configured to align with the first set of peripheral heatsink fins when the heatsink plate is disposed in a first configuration.

9. The system of claim 8, wherein the set of heatsink plate fins is configured to align with both the first set of peripheral heatsink fins, when the configurable heatsink plate is disposed in the first configuration, and the second set of peripheral heatsink fins, when the configurable heatsink plate is disposed in a second configuration.

10. The system of claim 8, wherein the heatsink plate fins are configured to align with the second set of peripheral heatsink fins when the heatsink plate is disposed in a second configuration.

11. The system of claim 8, further comprising an attachment mechanism for coupling the heatsink plate to the housing in one or more of a plurality of configurations.

12. The system of claim 8, wherein the SSD is configured to consume up to 25 Watts of power.

13. A method, comprising: providing a housing having: a first set of peripheral heatsink fins disposed parallel to a first axis of the housing; and a second set of peripheral heatsink fins disposed parallel to a second axis of the housing; and a set of heatsink plate fins disposed on a configurable heatsink plate adjacent to the first set of peripheral heatsink fins and the second set of peripheral heatsink fins, the set of heat sink plate fins configured to align with either the first set of peripheral heatsink fins or the second set of peripheral heatsink fins, and wherein the heatsink plate fins extend along a length of the configurable heatsink plate and are configured to align with the first set of peripheral heatsink fins when the heatsink plate is disposed in a first configuration.

14. The method of claim 13, further comprising:
determining a direction of airflow in a high-density drive storage system; and
arranging the set of heatsink plate fins in response to the direction of airflow.

15. The apparatus of claim 3, wherein the heatsink plate is a rotatable heatsink plate, and wherein the heatsink plate may be rotated from the first configuration to the second configuration.

16. The system of claim 10, wherein the heatsink plate is a rotatable heatsink plate, and wherein the heatsink plate may be rotated from the first configuration to the second configuration.

17. The method of claim 14, wherein arranging the set of heatsink plate fins in response to the direction of airflow comprises rotating the heatsink plate to the first configuration, and wherein the first configuration further comprises a configuration in which the airflow aligns with the heatsink plate fins and the first set of peripheral heatsink pins.

* * * * *